Figure 1:
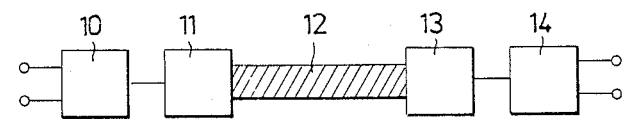

United States Patent [19]
Henoch

[11] Patent Number: 4,798,990
[45] Date of Patent: Jan. 17, 1989

[54] DEVICE FOR TRANSMITTING ELECTRIC ENERGY TO COMPUTERS AND DATA NETS

[76] Inventor: Bengt Henoch, Backvindeln 90, 126 57 Hägersten, Sweden

[21] Appl. No.: 91,868

[22] Filed: Sep. 1, 1987

[30] Foreign Application Priority Data

Sep. 11, 1986 [SE] Sweden ................................ 8603805

[51] Int. Cl.⁴ .............................................. H01L 41/08
[52] U.S. Cl. .................................... 310/334; 310/321; 310/323
[58] Field of Search .................. 310/311, 325, 321-323, 310/334; 333/236-239, 241, 242

[56] References Cited

U.S. PATENT DOCUMENTS

| | | | |
|---|---|---|---|
| 2,407,294 | 9/1946 | Shockley et al. | 310/334 X |
| 2,490,452 | 12/1949 | Mason | 310/334 X |
| 2,503,831 | 4/1950 | Mason | 310/334 X |
| 2,663,006 | 12/1953 | Andersen | 310/334 X |
| 2,695,357 | 11/1954 | Donley | 310/321 X |
| 2,700,738 | 1/1955 | Havens | 310/334 X |
| 3,521,089 | 7/1970 | Stuetzer | 310/321 |
| 3,546,498 | 12/1970 | McMaster et al. | 310/323 |
| 3,702,448 | 11/1972 | Boblett | 310/334 X |
| 3,749,947 | 7/1973 | Kawada et al. | 310/323 X |
| 3,922,622 | 11/1975 | Boyd et al. | 310/334 X |
| 3,975,698 | 8/1976 | Redman | 310/334 X |
| 4,450,376 | 5/1984 | Meitzler | 310/334 |

Primary Examiner—Mark O. Budd
Attorney, Agent, or Firm—Nies, Webner, Kurz & Bergert

[57] ABSTRACT

A device for transmitting electric energy to electric equipment, primarily computers and data nets, which device is intended to be connected between a voltage source and the electric equipment. The invention is characterized in that it is provided with a generator (30,31) comprising a piezo-electric element, which generator is intended to be connected to said voltage source and to generate a high-frequency mechanical wave motion, that a bar-shaped transmission member (32) is provided to transmit said motion to a receiver (33-35), which transmission member comprises a non-magnetic and electrically insulating material, in which the mechanical wave motion can be conducted, that said receiver, which is intended to be connected to the electric equipment, is capable to convert said mechanical wave motion into an electrically varying voltage by means of a piezo-electric element (33), which is in mechanical connection with said transmission member.

14 Claims, 4 Drawing Sheets

DEVICE FOR TRANSMITTING ELECTRIC ENERGY TO COMPUTERS AND DATA NETS

This invention relates to a device for transmitting electric energy electrically and magnetically interference-free through non-magnetic and electrically insulating materials to computers and data nets.

The device is of the kind comprising a receiving end or primary end where electric energy, for example from the supply mains, is fed in and converted into regular movements in the molecules, of which a material is composed, i.e. sound waves or vibrations, which can be transmitted through a non-magnetic and electrically insulating medium to a consuming end or secondary end where conversion to electric energy, for example direct current, takes place which can be consumed by a connected apparatus.

The object of the invention is to provide a device, which is simple to manufacture and handle, and where the electric insulation between receiving and consuming end is so great that electric and magnetic interferences cannot be coupled-over.

Satisfactory operation of computers and data nets required the elimination of electric and magnetic interferences.

For computers, interferences can imply that the computer derails, is caught in a loop rendering continued execution of the program impossible, or is so heavily loaded by intereference handling that the computer speed is reduced substantially.

For data nets, interferences can imply that communication is rendered difficult, such as that the transfer time is increased by repeated checkbacks, or that communication is made impossible or that incorrect data are transferred.

As a consequence of heavily increased automation in offices and industry, ever more powerful and rapid computers are used and connected to data nets, which must handle ever greater and more rapid data flows. Consequently, ' data nets and computers become ever more sensitive to electric and magnetic interferences.

Electric and magnetic interferences can be introduced in different ways.

One way is by conductive connection, so that the source of interference has earth, power or signal connections in common with the interfered apparatus.

Interferences by conductive connection are counteracted by breaking-up conductive connections by using opto switches and optical fibres for signal transmission. Interferences by remaining conductive connections for earth and power are dealt with by filtration.

Other ways are by capacitive connection, in such a way that the casing, earth, power or signal connections of the interference source are capacitively coupled to some part in the interfered apparatus, or by inductive coupling, in such a way, that the casing, earth, power or signal connections of the interference source are inductively coupled to some part in the interfered apparatus.

Interferences by capacitive and inductive coupling are dealt with by increasing the distances to the interference source and its conductive connections, by shielding and by using optical fibres or signal cables with twisted pairs and differential data transmission (for example EIA standard RS 485 or RS 422 A).

Another way is by radiation, in which case the interference source emits electromagnetic radiation, which gets its way into the interfered apparatus.

Interferences by radiation are dealt with, in that the interfered apparatus and its supply conduits are provided with electric and magnetic shieldings, possibly in combination with optical fibres.

It appeasrs from the aforesaid, that effective steps can be taken against all interferences, except those originating from or be coupled via conductive connections for power and earth. In view of the higher sensitivity to interferences due to more rapid and more powerful computers and to data nets with more rapid and greater data flows, it can be stated that the conductive connections required for power transmission and earth are a very weak spot in the interference protection.

The present invention provides a device for wireless tranmission of electric energy, at which all conductive connection to the sensitive parts of a computer or data net is cut so that the coupling-in of interferences is effectively prevented. By applying the invention together with known measures for interference protection, such as shielding and galvanic insulated signal connections, for example optical fibres and opto switches, computers and data nets can be built, which are insensitive to interferences even in environments extremely rich in interferences.

The invention relates to a device for transmitting electric energy to electric equipment, primarily computers and data nets, which device is intended to be connected between a voltage source and the electric equipment, comprising a generator, which is intended to be connected to said voltage source and capable to generate a high-frequency mechanical wave motion and comprises a transmission member capable to transmit said wave motion to a receiver, which transmission member comprises a non-magnetic and electrically insulating material, in which said mechanical wave motion can be conducted, and said receiver, which is intended to be connected to the electric equipment, is capable to convert said mechanical wave motion into an electrically varying voltage, and said generator and said receiver each comprise a piezoelectric element, which are in mechanical connection with said transmission member.

The invention is characterized in that said transmission member has the shape of a bar or corresponding continuous member, that the piezo-electric element of the receiver is connected to the first end of the transmission member while the piezo-electric element of the generator is connected to the other, opposed, end of the transmission member, and that the piezo-electric element of the generator is capable to generate longitudinal mechanical waves in the transmission member, and that a bar-shaped element is located on the opposite side of each of the piezo-electric elements relative to the transmission member, which bar-shaped elements are arranged to acoustically adapt the piezo-electric elements to the transmission member.

In the following exemplifying embodiments of the invention are described, at which invention transmission of electric energy is brought about to power units, which are to provide computers and data nets with electric voltage, without simultaneously transmitting electric and magnetic interferences. The invention, of course, can be applied also in such cases where there is demand to transmit electric energy wireless over short distances without producing a conductive connection.

The invention is not restricted to any definite such application field.

Figure 2:
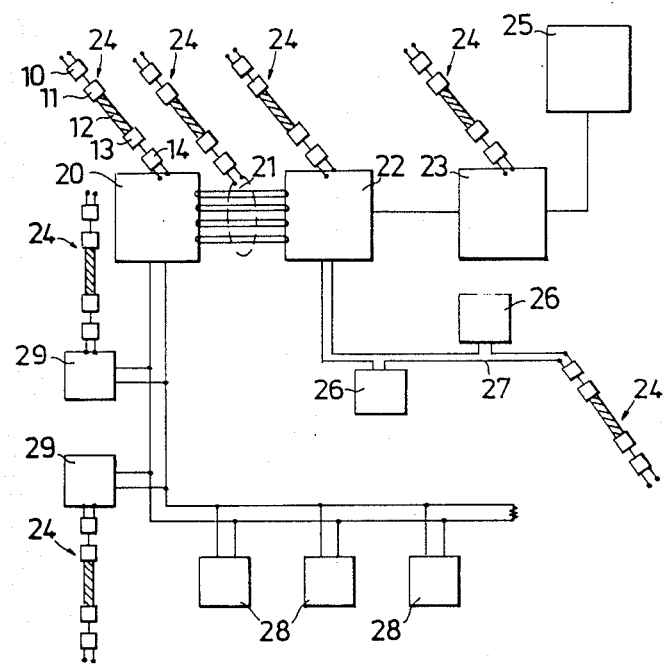
Figure 3:
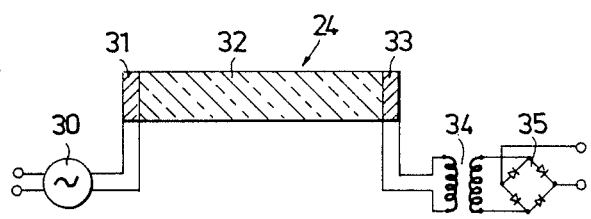
Figure 4:
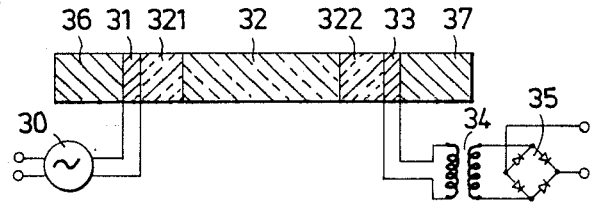
Figure 5:
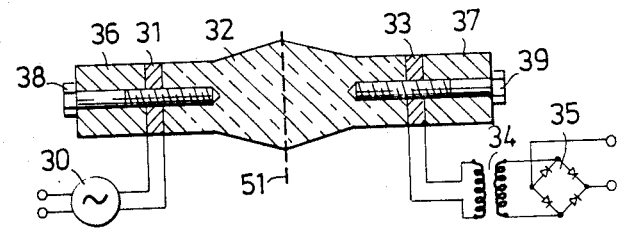
Figure 6:
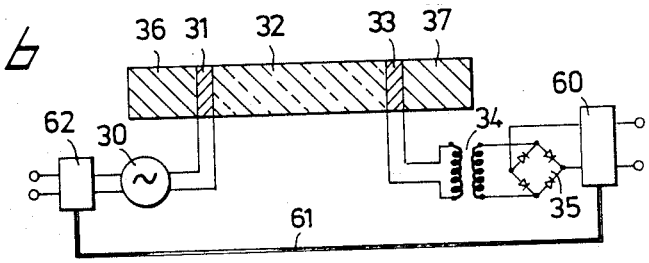
Figure 7:
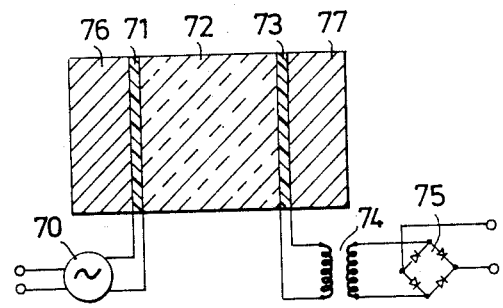
Figure 8:
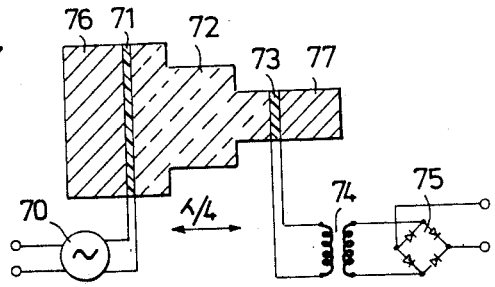
Figure 9:
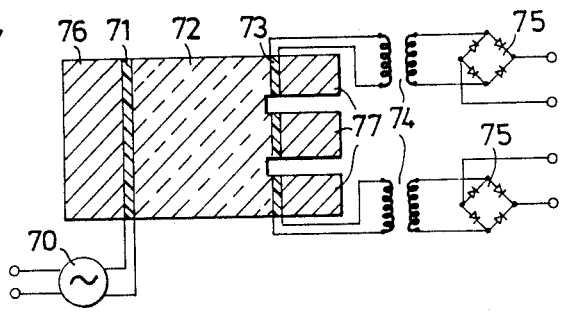
Figure 10:
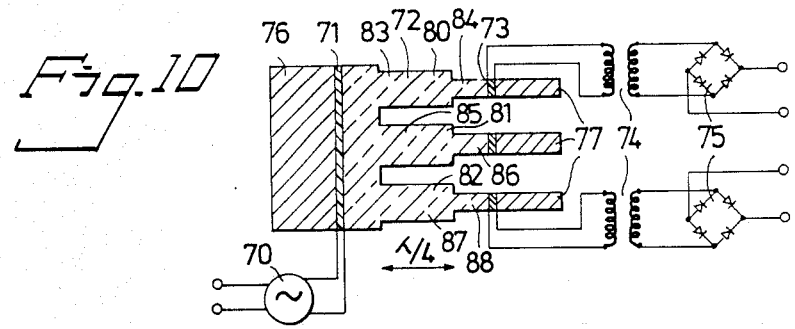
Figure 11:
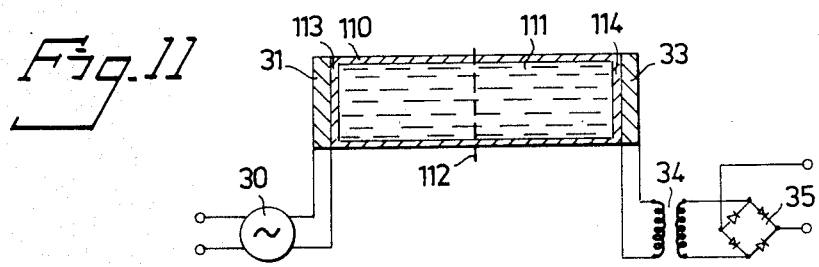
Figure 12:
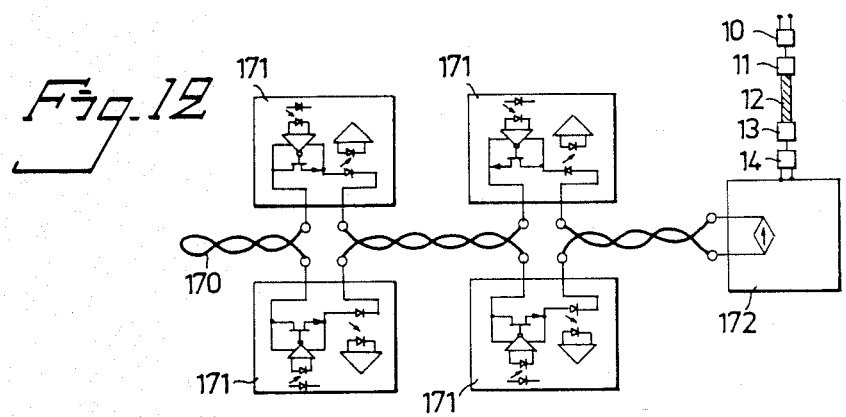
Figure 13:
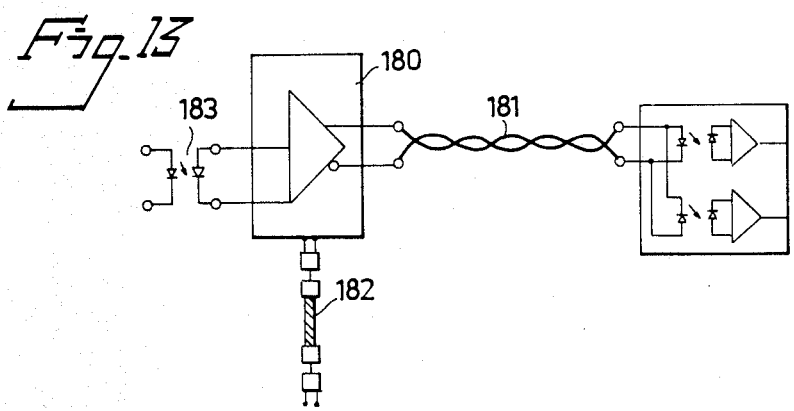
Figure 14:
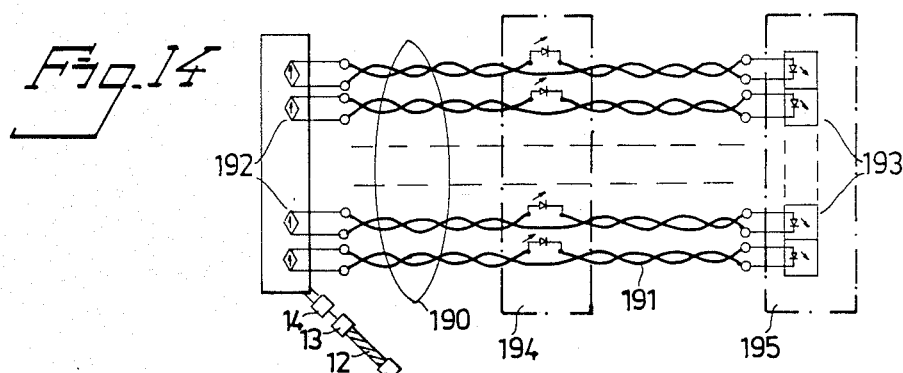
Figure 15:
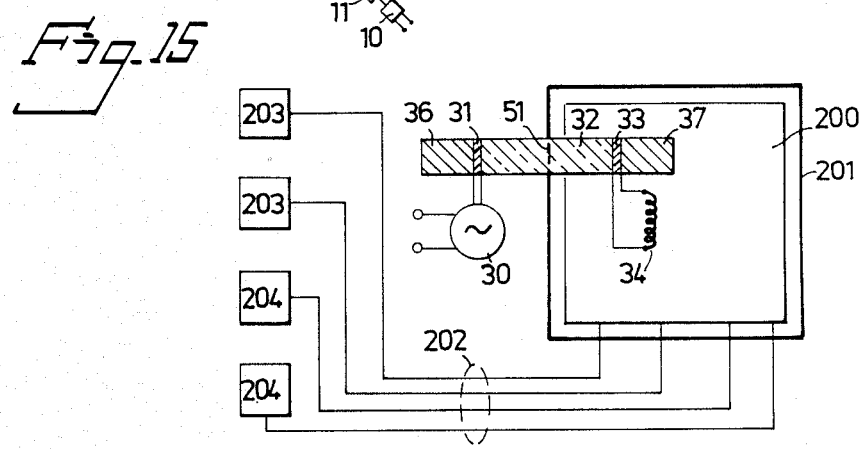
Figure 16:
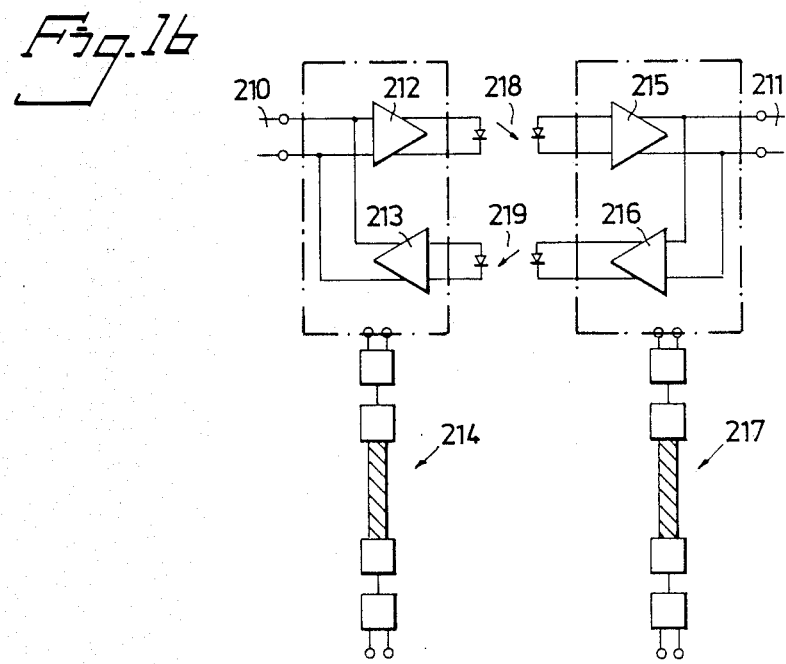

The invention is described in the following with reference to the accompanying drawings, in which FIG. 1 shows a basic embodiment of the invention, FIG. 2 shows an example of how computers and data nets can be provided wireless with electric energy, FIG. 3 illustrates a basic embodiment for generating longitudinal waves, where a piezo-electric transmitter, for example of ceramic, transmits and a piezo-electric detector, for example of ceramic, receives an ultrasonic wave, which is transmitted through a bar of electrically insulating and non-magnetic material, for example porcelain or glass, FIG. 4 illustrates an embodiment where a device according to the invention is given increased effectiveness, in that piezo-electric transmitter and receiver comprised therein are terminated on one side by a material, the extension of which corresponds to a quarter of the wave length at the transmitted ultrasonic frequency, FIG. 5 illustrates an embodiment where a device according to the invention can transmit a greater electric effect, in that piezo-electric transmitter and receiver are given a mechanical prestressing, FIG. 6 illustrates an embodiment where a measure of the electric effect consumption on the consuming end is transmitted via an optical fibre to the receiving end, so that losses and change in resonance frequency in the piezo-electric transmission can be compensated for, FIG. 7 illustrates an embodiment where a piezo-electric plastic film is used as transmitter and receiver for wireless transmission of electric energy by means of ultrasound, FIG. 8 shows how electrically insulating material between a piezo-electric transmitter and receiver can be arranged for voltage transformation, in that it is provided with a section, which has the length of a quarter of the wave length at the transmitted ultrasound frequency, FIG. 9 shows how several electrically insulating voltage sources are brought about by sectioning of the consuming end, FIG. 10 shows how sectioning of the consuming end in combination with sections with the length of a quarter of a wave length can yield voltage sources mutually insulated and with selected voltage, FIG. 11 illustrates an embodiment where ultrasound is transmitted through an electrically insulating liquid, FIG. 12 shows a data net electrically insulated from the surroundings, which net has the form of a current loop where transmitter and receiver are connected via opto switches and the current loop is driven by a power unit according to the invention, FIG. 13 shows a drive circuit for a signal cable for differential balanced voltage drive connected and driven without electric contact, FIG. 14 shows an electrically insulated data bus driven by means of a power unit with sectioned consuming end, as illustrated in FIGS. 9 and 10, FIG. 15 illustrates how a computer can be made entirely resistant against electric and magnetic interferences by providing it with an electric and magnetic shield, by connecting signal connections and transmitter via optical fibres and by wireless transmission of necessary electric energy FIG. 16 shows an electrically insulated transition, repeater, between e.g. two coaxial cables.

The basic mode of operation of the invention is apparent from FIG. 1.

A generator 10,11 is intended to be connected to an external voltage source, such as the general mains, and is capable to generate a high-frequency mechanical wave motion. The numeral 10 designates an electric high-frequency generator. The numeral il designates a generator comprising a piezo-electric element capable to convert the high-frequency electric voltage into a mechanical wave motion. A transmission member 12 is provided for transmitting said motion to a receiver 13. The said transmission member 12 comprises a non-magnetic and electrically insulating material, in which the electric wave motion can be conducted. The receiver 13, which is intended to be connected to the electric equipment, is capable to convert said mechanical wave motion into an electrically varying voltage by means of a piezo-electric element, which is connected mechanically to said transmission member 12.

The numeral 14 designates a circuit comprising a rectifier and a transformer, via which circuit the piezo-electric element of the receiver 13 is connected to the electric equipment.

By the device described, thus, electric energy is converted into vibrations, which are transmitted from the generator to the receiver by the transmission member, and which vibrations are converted in the receiver to electric energy. The vibrations preferably have ultrasonic frequency.

It appears from FIG. 2 how the invention is applied for wireless transfer of electric energy to computers and data nets. The computers 20,22 and 23 are connected to power units 24, via which they receive wireless transmitted electric energy. The computers 20 and 22 are connected to each other by a data bus 21, to which they are connected via opto switches. The data bus is activated by a power unit 24 according to the invention with several insulated current outputs. The computers 22 and 23 are in signal respect connected by optical fibres. The computer 23 comprises a sensor, a transmitter 25, connected via an optical fibre. The computer 22 is connected to sub-units 26 via a current loop 27. The connection to the current loop is over opto switch, and the current loop 27 is activated by a power unit 24 according to the invention. The computer 20 drives a signalling line with differential balanced voltage feed (for example RS422). To the signalling line are connected receivers 28 via opto switches and transmitters 29, which are driven by power units 24 according to the invention.

FIG. 3 shows a basic embodiment for generating longitudinal mechanical waves in a transmitting member, where 30 designates said electric high-frequency generator, which operates, for example, at 40 kc/s and is driven by supplied electric energy. The high-frequency generator 30 is connected to a disc or ring 31 of, for example, piezo-electric ceramic, such as lead zirconate, lead titanate, and with metal coats applied on each of its opposed sides. When a voltage from the generator 30 is applied over the metal coats, the disc 31 generates ultrasonic vibrations. The thickness of the disc 31 is so to be chosen that it is almost resonant at the frequency of the generator 30. The generated ultrasound effect is coupled mechanically to a transmission member in the form of a bar 32 of non-magnetic and electrically insulating material with good acoustic properties, for example glass or porcelain, in that the disc 31 is connected to the bar 32. To the other end of the bar 32 a receiver 33 of the same construction as the disc 31 is connected. When the ultra-sound wave transmitted through the bar 32 arrives at the receiver 33, an electric voltage of the same frequency as the ultrasound wave is generated between the two metal coats. This voltage is transformed preferably in a transformer 34 and rectified in a rectifier bridge 35.

According to this embodiment, thus, the generator comprises a piezo-electric element 31, which is connected to the other end of said bar 32 while the piezo-electric element 33 of the receiver is connected to the first end of the bar 32.

In order to improve the switch-in and switch-off of ultra-sound into and from the bar 32, according to the invention the free ends of the piezo-electric elements 31 and 33 are terminated by bar-shaped elements 36 and 37, as shown in FIG. 4, with good acoustic transmission, which elements 36 and 37 are arranged to acoustically adapt the piezo-electric elements to the transmission member. The elements 36 and 37 preferably have the length of a quarter of the wave length at the frequency in question. For improving the adaptation to the acoustic impedance of the bar 32, it can be of advantage to position layers of another suitable material 321 and 322 between the piezo-electric elements 31 and 33 and the bar 32.

At a comparison with FIG. 1, thus, the high-frequency generator 30 corresponds to the block 10, the piezo-electric element 31 to the block 11, the bar 32 to the transmission member 12, the piezo-electric element 33 of the receiver to the block 13, and the transformer 34 and rectifier 35 to the block 14.

In the following the designations 30,31,32,33,34 and 35 are used in connection with different embodiments for elements corresponding to the elements shown in FIG. 3.

The ultra-sound effect, which can be transmitted, is restricted by the strength in the piezo-electric elements 31 and 33 and their joints to the bars 32,36 and 37. This strength, as shown in FIG. 5, can be increased by mechanical prestress brought about by threaded and tightened bolts 38 and 40.

In order to obtain good transmission of as well as conversion into and from acoustic energy, it is important that the piezo-electric elements 31 and 33 are almost resonant at the frequency for the high-frequency generator 30. When the electric effect output on the consuming end is changed, the resonance frequency and figure of merit for the piezo-electric elements 31 and 33 change, which yields an undesirable reduction of the efficiency degree. FIG. 6 shows a sensor 60, which is capable to sense current and voltage on the consuming end and transmit these values via an optical fibre 61 to an adjusting means 62 capable to adjust the frequency of the generator 30 so that maximum efficiency is obtained. Maximum efficiency is obtained when the mechanical system comprising the transmission member swings with its resonance frequency. A corresponding adjusting system can be applied to all embodiments described above and below, except the embodiments described with reference to Figs. 15 and 16.

In FIGS. 5-6 embodiments according to the invention are shown where piezo-electric ceramic is used for converting electric energy into acoustic energy, to transmit the same and again convert it into electric energy. Such devices when designed at optimum can convert and transmit effects at least up to 100 watt with efficiency degrees up to 90 %.

For the stated effect, the power unit 24 has a natural size, which corresponds approximately to the size in FIG. 3.

In FIG. 7 an embodiment of the invention is shown where a plastic film coated on both sides with metal is used for converting electric energy into acoustic energy and vice versa. It is known that the plastic polyvinylidene fluoride after treatment with heat and strong electric fields shows piezo-electric properties. The piezo-electric plastic has lower acoustic impedance and withstands a higher electric field strength than piezo-electric ceramic. This facilitates the adaptation to electrically insulating materials, which often have low acoustic impedance, and renders it possible to transmit greater effects. According to the embodiment, a high-frequency generator 70, for example at 40 kc/s, is driven by supplied electric energy and coupled between the two metal layers on a piezo-electric plastic film 71. The plastic film 71 thereby generates an ultra-sound wave, which is transmitted through a bar 72 or a layer of non-magnetic and electrically insulating material. The ultra-sound wave is received by a metal-coated piezo-electric plastic film 73. The electric voltage from the piezo-film 73 is transformed in a transformer 74 and rectified in a rectifier bridge 75 in order to yield the desired voltage on the consuming end. Behind the films 71 and 73 bars or layers 76,77 corresponding to the bar-shaped elements 36,37 described above are located, which by acoustic impedance and acoustic length, about a quarter of wave length, are arranged to adapt the films 71,75 to the material 72.

In the embodiments shown in FIGS. 7-10 the detail 70 corresponds to the block 10 in FIG. 1, while the detail 71 corresponds to the block 11, the detail 72 to the transmission member 12, the detail 73 to the block 13, and the transformer 74 and rectifier 73 to the block 14. Included are also elements 76 and, respectively, 77 in the generator 11 and, respectively, receiver 13 in FIG. 1.

In FIG. 8 the bar 72 is shown designed to provide a voltage transforming between the films 71 and 73. At the film 73 the bar or layer 72 has a cross-section or an acoustic impedance (sound velocity) other than at the film 71. The bar 72 is designed so as to have one or several intermediate longitudinal sections with a cross-section or an acoustic impedance (sound velocity), which is different of the cross-section at the respective ends of the bar, i.e. at the films 71 and 73. When such an intermediate longitudinal section is used, its effective acoustic impedance expressed in cross-section or sound velocity is the geometric mean value between the values at the films 71 and, respectively, 73. Behind the films 71,73 bars or layers 76,77 are located, which by acoustic impedance and acoustic length, about a quarter of a wave length, are arranged to adapt the films to the bar 72.

On the receiver end several receivers electrically insulated from each other can be obtained in the way illustrated in FIG. 9. This is achieved in that the film 73 is sectioned into as many electrically insulated sections as electric voltage sources are desired. The sectioning of the film 73 can be carried out either on the two metal coats or through the entire film. Behind the film 73 bars or layers 77 are located, which by acoustic impedance and acoustic length, about a quarter of a wave length, are arranged to adapt the film 73 to the bar 72. The bar 72 preferably, but not necessarily, is sectioned according to the sectioning of the film 73. The bar 72 can be designed so as on its end located at the receiver, where the sectioned film is located, to have two or more projections, each of which co-operates with a section of the film 73. To each section of the film 73 a transformer 74 and a rectifier bridge are separately connected, although only two such connections are shown in FIG. 9.

In FIG. 10 an embodiment is shown, at which voltage transforming is obtained in connection with energy transmission to several insulated voltage sources according to FIG. 9. This is achieved by sectioning the bar 72 so that said projections 80,81,82 are given a considerable length and each projection comprises two or more longitudinal sections 83,84; 85,86,87,88 with cross-sections of different size where the end surface of each projection cooperates with a film 73. Behind the films are located, in the manner set forth above, bars or layers 77 in order to obtain acoustic adaptation to the respective projection. The different longitudinal sections preferably are designed with a length, which corresponds to one-fourth of the wave length of the frequency transmitted in the longitudinal sections.

According to a further embodiment different longitudinal sections of different materials with different acoustic properties are provided.

When it is desired to position the different voltage sources in different places which, however, are located close to each other, it can be practical to design the different said longitudinal sections with different length for the different voltage sources. In FIG. 10 the inner section 101 has a lower sound velocity than the section 102. The section 105 has a higher sound velocity than the section 102. This increase in sound velocity, counted from inside, can be in steps or by degrees. This variation of the sound velocity over the cross-section concentrates the acoustic energy to the centre of the section, which allows for longer transmission distances.

In the embodiments of the invention shown in FIGS. 3-10, thus, the acoustic energy is transmitted through solid elastic materials, which are non-magnetic and electrically insulating.

According to a further embodiment of the invention, the acoustic energy is transmitted by means of a transmission member comprising a fluid material. This embodiment is illustrated in Fig. 11.

In FIG. 11 a tube 110 is shown, in which a fluid material 111 is included. The fluid material is electrically insulating and non-magnetic. According to a preferred embodiment, the fluid material is distilled water or an electrically insulating oil.

The tube is also of an electrically insulating and non-magnetic material, preferably glass or plastic.

The end surfaces of the tube 110 consist according to one embodiment of diaphragms 113,114, to which a piezo-electric element 51,55 are connected. Alternatively, the respective piezo-electric element 31,33 can constitute the respective end wall of the tube.

The generator, thus, comprises a piezo-electric element 31 attached to one end surface of the tube 110 and arranged to be fed by an electric high-frequency generator 30. The piezo-electric element 33 of the receiver is connected to the other end of the tube.

According to this embodiment, the ultra-sound wave is transmitted substantially or entirely by means of the fluid material.

The voltage generated in the receiver is transformed in a transformer 34 and rectified in a rectifier bridge 33.

In the foregoing embodiments have been described where longitudinal ultra-sound waves are excited by means of a transmitter in the form of a piezo-electric element.

In order to fully protect an electric equipment, which is fed with energy by means of the present power unit 24, preferably a shield, such as a metal net or a metal diaphragm, is provided through the transmission member transversely to the propagation direction of the mechanical wave motion and located in a node formed where the transmission member is fed with the intended frequency of the generator. Normally a node is located centrally between the ends of the transmission member. The shield is intended to be connected to an outer shield, which encloses the equipment desired to be protected, in order thereby to form a Faraday's cage about the equipment. In FIG. 5 such a shield is illustrated by a metal diaphragm or metal net 51 cast-in in the bar 32.

In FIG. 11 such a shield is illustrated by a metal diaphragm or metal net 112 extending through the fluid material 111 and tube 112.

FIGS. 12-16 show how a device for transmitting electric energy according to the invention can be applied to interference-free power units for computers and data nets.

In FIG. 12 the numeral 172 designates a current source with supplied electric energy according to the invention, which drives a current, for example 20 mA, through a current loop 170. To said current loop 170 a plurality of transmitter/receiver units 171 are coupled, which via opto switches receive digital signal in the form of current interruption and emit digital signals in the form of current interruption. The current loop in general is designed in a normal professional way, for example with twinned two-wire circuit. From an interference point of view, an advantage is that a current loop is obtained which is electrically insulated from the surroundings, and transmitter/receiver units, which are electrically insulated both from the current loop and from each other.

In order to render possible more rapid data transmission over greater distances, improved methods for data transmission on wire have been developed. One such method implies a differential balanced drive of a two-wire circuit and has been standardized, for example, in EIA RS 422 or EIA RS 485. In FIG. 15 is shown how such a two-wire circuit can be electrically insulated from connected transmitters and receivers. A connected receiver can be insulated in known manner from the two-wire circuit. A transmitter, however, is active and via two outputs transmits ut a signal and its complementary on the two-wire circuit, and therefore the driver-portion (final stage) must have galvanic contact with the two-wire circuit. In FIG. 13 a driver 180 for a transmitter is shown, which drives a two-wire circuit 181. The driver 180 receives its electric energy via a power unit 182 according to the invention. Signals to the driver 180 are switched-in via opto switches 183. The two-wire circuit in general is designed in normal professional manner, for example with twinned two-wire circuit. From an interference point of view, it is an advantage that a two-wire circuit for differential balanced driving is obtained which is electrically insulated from the surroundings and from connected transmitters and receivers.

In FIG. 14 is shown how on a data bus the different bit lines can be insulated electrically from the surroundings and from each other. In a data bus line 190 each bit line 191 consists of a current loop. The numerals 194 and 195 designate computers. To each current loop a current generator 192 is coupled, which receives electric energy supplied according to the invention and drives a current, for example 20 mA, through the current loop. As shown in FIGS. 9 and 10, the electric energy source can be common on the receiving end and then on the consuming end by sectioning yields several energy sources, one for each bit line, which are electrically insulated from each other and from the surroundings. Communication with the data bus is effected in that to each bit line transmitter/receiver units 195 are connected, which via opto switches transmit and receive digital signals in the form of current interruption.

FIG. 15 shows how a central unit 200 in a computer entirely can be insulated against electric and magnetic interferences. The central unit 200 is surrounded by an electric and magnetic shield 201 made, for example, of my-metal. Electric energy is supplied in the way shown for example in FIGS. 4 and 5, in that an ultra-sound wave is transmitted through a bar 52, which extends into a hole in the shield 201. The bar 52 is excited so that a node is located at the passage of the shield 201, and that at this node a metal diaphragm or metal net 51 is cast-in in the bar and electrically connected to the shield 201. All communication between the central unit 200 and the surrounding takes place via optical fibres 202, which pass through holes in the shield 201. To the optical fibres can be connected, for example, transmitter/receiver units 203 or sensors 204.

FIG. 16 illustrates how a signal connection via, for example, a twinned two-wire circuit or a coaxial cable can be broken up into several sections, exemplified by the sections 210 and 211, which are electrically insulated from each other and from the surroundings. At the end of section 210 a receiver 212 and a transmitter 213 are located which are driven by a power unit 214 according to the invention. At the beginning of section 211 a transmitter 215 and a receiver 216 are located which are driven by a power unit 217 according to the invention. The transmitter 215 receives via an opto switch 218 signals from the receiver 212, and the transmitter 213 receives via an opto switch 219 signals from the receiver 216. The power units 214 and 217 can be driven as in FIGS. 9 and 10 by a common energy source on the primary end.

In the foregoing different embodiments and applications of the invention have been described. Combinations of designs and applications can also be made in many other ways, which is obvious to the expert.

The present invention, thus, must not be regarded restricted to the embodiments set forth above, but can be varied within its scope defined in the attached claims.

I claim:

1. A device for transmitting electric energy to electric equipment, primarily computers and data nets, which device is intended to be connected between a voltage source and the electric equipment, comprising a generator, which is intended to be connected to said voltage source and capable to generate a high-frequency mechanical wave motion and comprising a transmission member capable to transmit said motion to a receiver, which transmission member comprises a non-magnetic and electrically insulating material, in which the mechanical wave motion can be conducted, and said receiver, which is intended to be connected to the electric equipment, is capable to convert said mechanical wave motion into an electrically varying voltage, and said generator and said receiver each comprises piezo-electric element, which are in mechanical connection with said transmission member, characterized in that said transmission member (12;32;72;110;11) has the shape of a bar or corresponding continuous member, that the piezo-electric element (31;33;73) of the receiver (13;14;33-35;73-75) is connected to the first end of the transmission member while the piezo-electric element (31;71) of the generator (10;11;30;31;70;71) is connected to the other, opposed end of the transmission member, that the piezo-electric element (31;71) of the generator is capable to generate longitudinal waves in the transmission member (12;32;72;110-111), that a bar-shaped element (36;37;76;77) is located on the opposite side of each of the piezo-electric elements (31;33;71;73) relative to the transmission member, which bar-shaped elements (36;37;76;77) are capable to acoustically adapt the piezo-electric elements to the transmission number, that said electric equipment is surrounded by a shield such as a metal net or a metal wall to form a Faraday's cage around the electric equipment through which shield the transmission member runs and that said piezo-electric elements consist of a flat, round element such as a disc or ring, provided with metal coats on its opposed side surfaces which coats constitute the two poles on the receiver side which coats are not in electrical contact with the Faraday's cage.

2. A device as defined in claim 1, characterized in that the piezo-electric element (33;73) of said receiver (13,14;33-35;73-75) is connected to a rectifier (55;75) preferably via a transformer (34;74).

3. A device as defined in claim 1, characterized in that said transmission member, which is in the form of a bar (32;72;151) or corresponding shape, is made of a solid and elastic material, preferably glass or porcelain.

4. A device as defined in claim 1, characterized in that said transmission member is in the form of a tube (110) of non-magnetic and electrically insulating material, which includes a fluid material (111), which is non-magnetic and electrically insulating and the piezo-electric element (31) of the generator is connected to one end of the tube (110), and the piezo-electric element (33) of the receiver is connected to the other end of the tube (110).

5. A device as defined in claim 3, characterized in that the piezo-electric element (31;71) of said generator is arranged to be fed with a high-frequency voltage from a high-frequency generator (30;-0).

6. A device as defined in claim 5, characterized in that the bar (72) at one end has a cross-section, the size of which differs from the cross-section of the bar at its other end, and that between the ends one or several intermediate longitudinal sections of the bar are located, the cross-section of which differs from the cross-section at the respective ends of the bar.

7. A device as defined in claim 5, characterized that said receiver (75-75) is divided into two or more receivers electrically insulated from each other, in that the receiver comprises two or more piezo-electric elements (73) electrically separated from each other, and that the bar (72) at its end located at the receiver is provided with two or more projections (80-82), each of which independently cooperates with an associated one of said electrically separated receiver piezo-electric elements (73) which are electrically insulated from each other.

8. A device as defined in claim 7, characterized in that one or more of said projections (80-82) comprise one or more longitudinal sections (83-88) with cross-sections of different size.

9. A device as defined in claim 6, characterized in that different longitudinal sections (83-88) consist of material with different acoustic properties.

10. A device as defined in claim 1, characterized in that said piezo-electric elements (31,33) consist of a disc or ring of a piezo-electric ceramic, which disc or ring on its opposed side surfaces is provided with metal coats.

11. A device as defined in claim 1, characterized in that said piezo-electric elements (71,73) consist of a piezo-electric plastic film, wich on its opposed side surfaces is provided with a metal coat.

12. A device as defined in claim 1, characterized in that said bar-shaped element (36,37;76,77) has good acoustic transmission and a length, which corresponds to one-fourth of the wave length of the frequency, which is intended to be transmitted by means of said bar.

13. A device as defined in claim 1, characterized in that a shield (51;112), such as a metal net or metal diaphragm, is arranged through the transmission member (32;110,111 transversely to the propagation direction of the mechanical wave motion and located in a node formed where the transmission member is fed with the intended frequency of the generator (30,31), which shield (51;112) is intended to be connected to an outer shield, which encloses the equipment to be protected, in order thereby to form a Faraday's cage about the equipment.

14. A device as defined in claim 1, characterized in that to the receiver a sensor (60) is connected to sense current and voltage on the receiving end and to transmit this information via an optic fibre (61) to an adjusting means (62), which is arranged to adjust the frequency of the generator so that maximum efficiency degree is obtained at different electric loads of the receiver.

* * * * *

UNITED STATES PATENT AND TRADEMARK OFFICE
CERTIFICATE OF CORRECTION

PATENT NO. :  4,798,990
DATED      :  January 17, 1989
INVENTOR(S) :  BENGT HENOCH It is certified that error appears in the above-identified patent and that said Letters Patent is hereby corrected as shown below:

Column 4, line 7, "il" should be --11--.

<u>IN THE CLAIMS:</u>  (Claim 1)

Column 9, lines 67 and 68, "comprises" should read --comprise a--.

Column 10, line 2, "11" should be --111--.

Column 10, line 16, "number" should be --member--.

Signed and Sealed this

Eighteenth Day of July, 1989

Attest:

DONALD J. QUIGG

Attesting Officer   Commissioner of Patents and Trademarks